United States Patent
Bruno

(10) Patent No.: US 7,161,345 B2
(45) Date of Patent: Jan. 9, 2007

(54) POWER MONITORING SYSTEM THAT DETERMINES PHASE USING A SUPERIMPOSED SIGNAL

(75) Inventor: David Bruno, Portland, OR (US)

(73) Assignee: Veris Industries, LLC, Portland, OR (US)

( * ) Notice: Subject to any disclaimer, the term of this patent is extended or adjusted under 35 U.S.C. 154(b) by 151 days.

(21) Appl. No.: 10/936,930

(22) Filed: Sep. 9, 2004

(65) Prior Publication Data

US 2006/0049819 A1   Mar. 9, 2006

(51) Int. Cl.
  *G01R 11/32*   (2006.01)
(52) U.S. Cl. ...................................... 324/142
(58) Field of Classification Search ............... 324/142, 324/117 H, 141, 765, 158.1; 361/601, 605, 361/611–624, 626–628; 340/637–638
  See application file for complete search history.

(56) References Cited

U.S. PATENT DOCUMENTS 4,241,237 A * 12/1980 Paraskevakos et al. 379/106.06
5,391,983 A * 2/1995 Lusignan et al. ........... 324/142
6,861,683 B1 * 3/2005 Rissing et al. ................ 307/38

OTHER PUBLICATIONS

Veris Industries LLC, "Power Monitoring" product description, of at least one year prior to filing date, no month/year.

* cited by examiner

*Primary Examiner*—Ha Tran Nguyen
*Assistant Examiner*—Tung X. Nguyen
(74) *Attorney, Agent, or Firm*—Chernoff, Vilhauer, McClung & Stenzel

(57) ABSTRACT

A power monitoring system comprising a first current sensor suitable to sense first changing electrical current within a first conductor to a first load and a first conductor. A second conductor sensing a first voltage potential provided to the first load. A power monitor superimposes a first signal on the first conductor and first current sensor such that the first signal is sensed on the other of the first conductor and first current sensor. Associating the first voltage potential with first changing electrical current in the power usage calculation of the first load.

12 Claims, 9 Drawing Sheets

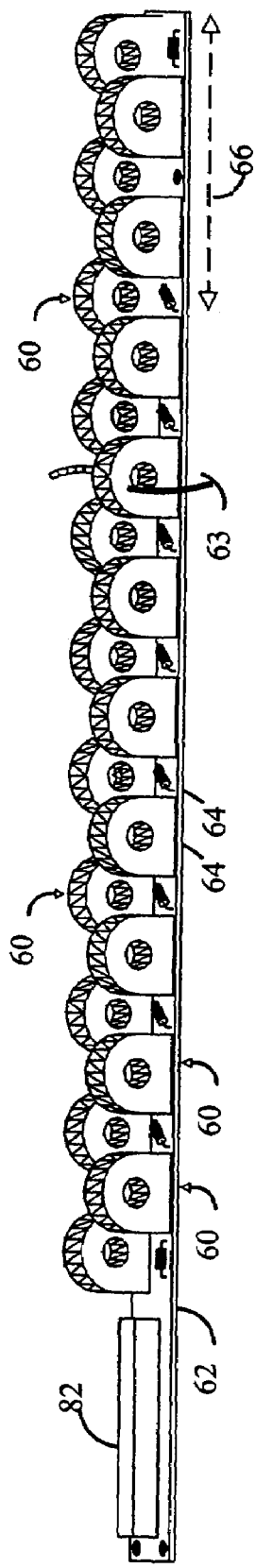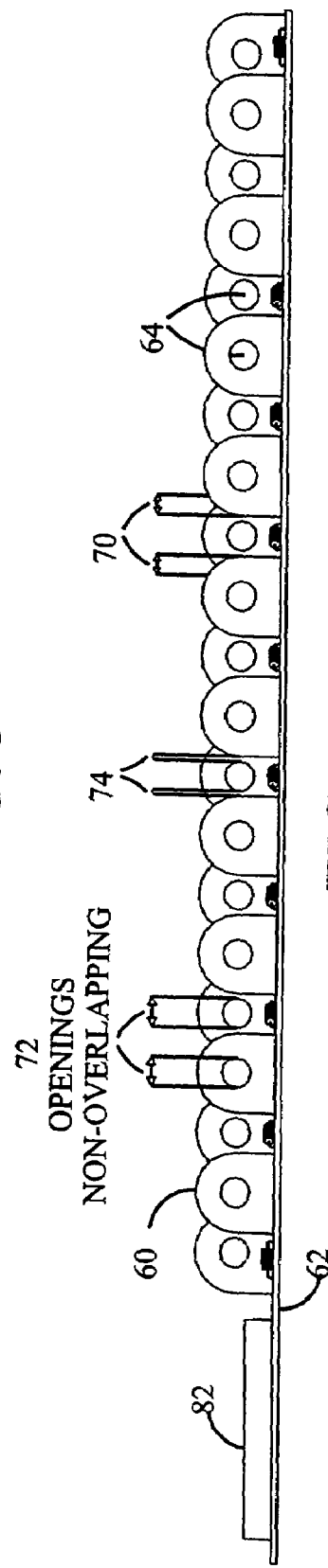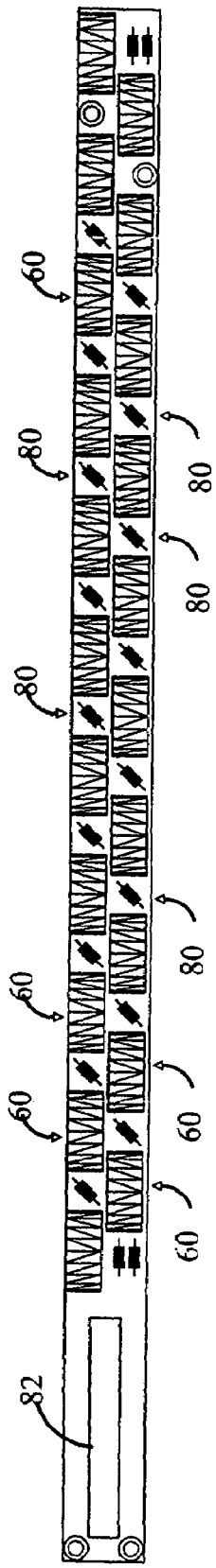

RIGHT CT STRIP

CONFIGURATION UTILITY

| | LOAD NUMBER | VOLTAGE | PHASE | ENABLE POWER FACTOR | USE OTHER PHASES | POWER FACTOR PRESET |
|---|---|---|---|---|---|---|
| SENSOR 1 | 1 | 1 | A | ✓ | | .71 |
| SENSOR 2 | 1 | 2 | B | ✓ | | .72 |
| SENSOR 3 | 1 | 3 | C | ✓ | | |
| SENSOR 4 | 2 | 2 | B | ✓ | ✓ | |
| SENSOR 5 | 2 | 3 | C | ✓ | ✓ | |
| SENSOR 6 | 3 | 1 | A | ✓ | | |
| SENSOR 7 | 3 | 2 | B | ✓ | | |
| SENSOR 8 | 3 | 3 | C | ✓ | | |
| SENSOR 9 | 6 | 3 | B | | ✓ | |
| SENSOR 10 | 7 | 3 | C | | ✓ | |
| SENSOR 11 | 8 | 2 | A | | | .8 |
| SENSOR 12 | 8 | 1 | B | | | .7 |
| SENSOR 13 | 8 | 3 | C | | | |
| SENSOR 14 | | | | | | |
| SENSOR 15 | | | | | | |

| VOLTAGE SETTING | | ENABLE | VALUE |
|---|---|---|---|
| | PHASE 1 | | |
| | PHASE 2 | ✓ | 122 |
| | PHASE 3 | | |

FIG. 13

POWER MONITORING SYSTEM THAT DETERMINES PHASE USING A SUPERIMPOSED SIGNAL

BACKGROUND OF THE INVENTION

The present invention relates to a phase determination system.

Referring to FIG. 1, many electrical power distribution systems include a panel enclosure 10 into which is provided electrical power using one or more sets of wires 12. The electrical power may have any voltage, any current, and any number of phases (e.g., single phase, two phases, or three phases). Each phase of the electrical power to the power panel is normally provided to a separate bus bar 14a, 14b, and 14c, which are normally elongate conductors within the power panel 10. A plurality of circuit breakers 16a, 16b, 16c, etc., which trip or otherwise selectively disconnect electrical power, are electrically interconnected between one or more of the bus bars 14a, 14b, and 14c, and respective loads 18 external to the power panel 10. In many power panels 10 the circuit breakers 16 are vertically aligned in one or more strips 20 and 22. When the load 18 interconnected to a respective circuit breaker 16 within the power panel 10 draws excessive electrical current then the circuit break 16 trips or otherwise disconnects the electrical power to the load 18. In this manner, if a load shorts and thereafter draws excessive current then the circuit breaker will trip. Frequently, the load will be a three-phase load having three wires provided thereto, with one or more corresponding circuit breakers. For example, in many cases if one phase of a three phase circuit breaker trips, all three phases of the circuit breaker will disconnect power to the associated load.

In many business environments a set of electrical loads, such as motors, lighting, heating units, cooling units, machinery, etc., may be electrically interconnected to one or more circuits, each of which may be a single phase or multi-phase. Obtaining the total power usage of the business may be readily obtained by reading the power meter provided by the power utility. The power meter is normally electrically interconnected between the power panel and the power utility. In many circumstances, it is desirable to monitor the power consumption of individual loads or groups of loads. The use of power meters permits effective monitoring of the power consumption of particular loads. Also, a set of power meters permits effective sub-metering of different loads, buildings, or groups of loads to attribute and monitor the power usage of the business. For example, the power sub-metering may be used to attribute the power costs charged by the utility to different buildings, departments, or cost centers. The traditional approach to monitoring such power usage is to install a power meter at a location proximate the load itself. To install a typical power meter on a three phase load, a current sensor is located around each wire of the three phases and a voltage connection is electrically interconnected to each wire. Such a power meter is available from Veris Industries, LLC under the name H8035 Power Meter.

BRIEF DESCRIPTION OF THE DRAWINGS

FIG. 3 illustrates a perspective view of an exemplary embodiment of a support for a set of current sensors.

FIG. 4 illustrates a side view of the support and sensors of FIG. 3.

FIG. 5 illustrates a top view of the support and sensors of FIG. 3.

FIG. 13 illustrates the configuration of the current sensors and voltage sensing.

DETAILED DESCRIPTION OF THE PREFERRED EMBODIMENT

A power panel 10 provides a centralized location where the currents in the wires to several different loads may be sensed and the voltage in the bus bars that correspond with the currents may be sensed, with both being readily available. Moreover, the power provided from the bus bars to multiple different loads has the same voltage potential and phase relationship with respect to each of the different loads. In other words the power factor, which is a phase relationship between the voltage and current provided to a load, may be determined based on the current to the particular load and the voltage in the respective bus bar. For a plurality of different loads the relationship between the respective currents/voltages and power factor may be determined using the same bus bars. This commonality of voltages among different loads may be used by sensing the voltage potential together with its phase from each of the bus bars, preferably using one and only one electrical interconnection for each phase. The voltage potential together with its phase relationship sensed from one or more bus bars may be used together with the respective sensed currents provided to the different loads to determine the instantaneous power usage and power consumed over a period of time for any particular load. In this manner, only a single interconnection for sensing the voltage potential is necessary for each phase for multiple loads, each of which may have one or more associated current sensors. The use of a single interconnection for sensing the voltage of each phase for multiple different loads decreases the time for installation, the expensive of the power monitoring system, and decreases the likelihood of inadvertently mis-connecting the voltage sensing connections. The use of a generally centralized location for sensing the voltage and current for several different loads potentially permits easier installation of the power monitoring system to a computer network for subsequent processing. Moreover, the centralized location reduces the technicians expense of locating suitable locations for the power meter for a particular load. Further, the servicing of the power meters is more readily done because of their proximity to one another.

Figure 2:
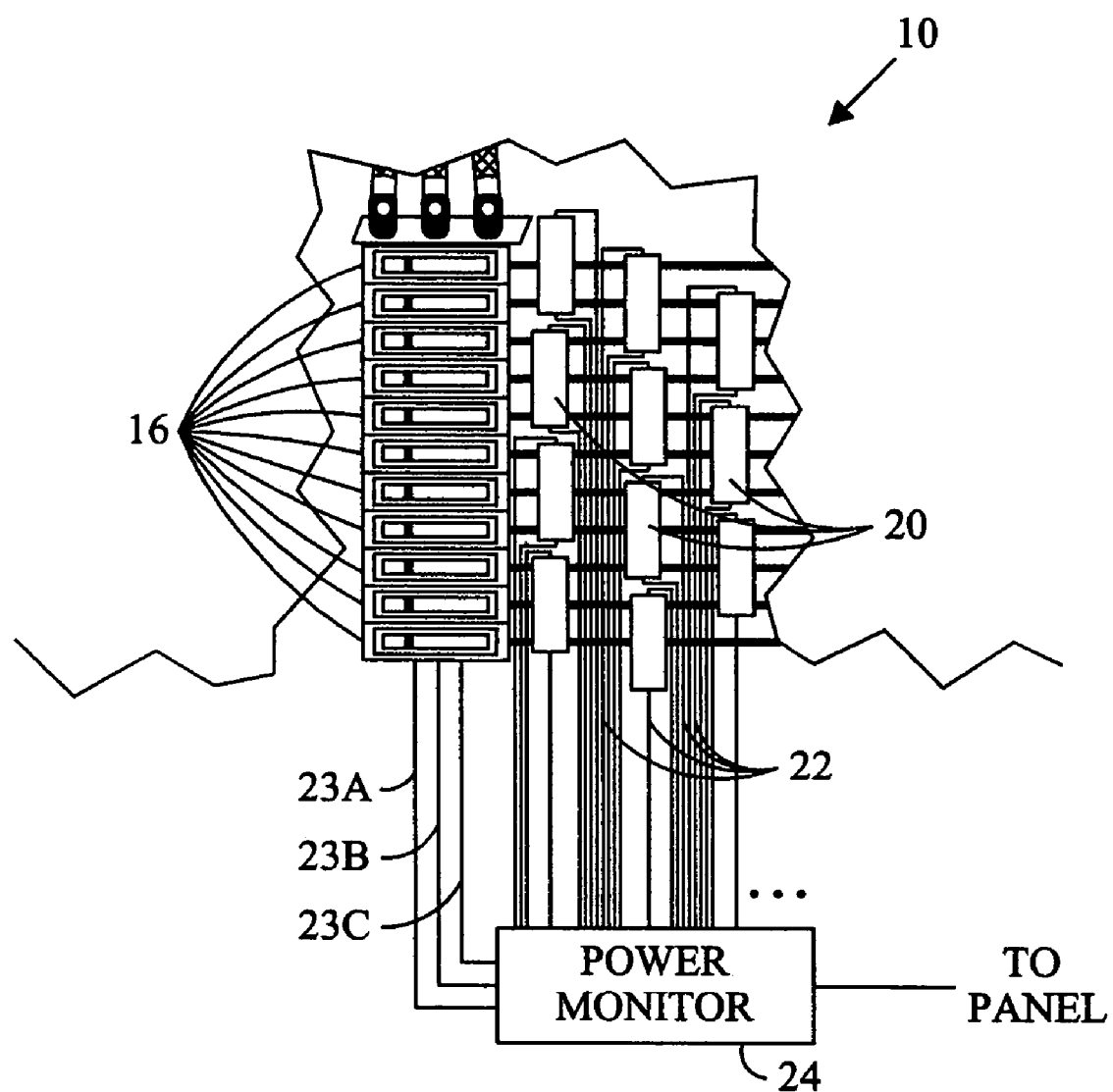
FIG. 2 illustrates circuit breakers, associated sensors, and a power monitor.

Referring to FIG. 2, to monitor the power provided to a particular load from one or more individual circuit breakers 16 a respective current sensor 20 may be interconnected to the wire on the load side of the respective circuit breaker 16. Typical circuit breakers may include a single phase, two phases, or three phases. The outputs 22 of each of the current sensors 20 may be interconnected to a power monitor 24. The current sensors 20 may be interconnected to one or more power monitors. Also, the current sensors 20 may likewise be daisy chained together, or interconnected to the power monitor(s) in any other suitable manner. An electrical interconnection from each bus bar to the power monitor(s) normally includes wires 23a, 23b, 23c to sense the voltage and its corresponding phase relationship. Alternatively, the voltage potential and phase relationship for each phase may be sensed from locations other than the bus bars 14a, 14b, and 14c, such as for example, a wire provided to a load, the load side of a circuit breaker, the utility side of a circuit breaker, a capacitive coupling to the voltage potential, or the wire connection from the utility. It is to be understood that the power monitor may calculate power based upon a single phase, two phases, and/or three phases, etc., as desired. In essence, the power monitoring system may use the electrical path from the power monitor 24 to the bus bars (or otherwise) of at least one of the phases for a plurality of different loads. Typically, the power is calculated by multiplying the voltage, corresponding current, and corresponding power factor which relates to the phase relationship between the voltage and current.

Referring to FIG. 3, a set of sensors 60 may be supported by a support 62 which maintains the current sensors 60 in a fixed spatial relationship with respect to one another. Preferably the support 62 is rigid or semi-rigid, while a flexible support 62 that is installed on a rigid or a semi-rigid supporting member(s) may likewise be used. The sensors 60 are preferably current sensors, or alternatively, other types of sensors may be used. The sensors 60 are preferably wire wound torodial coils on a metallic or non-metallic core enclosed within a plastic housing through which a wire 63 may be extended, and the housings are at least partially surrounding the respective coil. Changing current within the wire 63 induces a changing magnetic field around the wire 63. The changing magnetic field in turn induces a changing current within the wire wound torodial coil. The changing current within the torodial coil may be used directly or converted to any suitable signal, such as for example, a voltage signal, or a different current signal.

The openings 64 defined by the sensors 60 are preferably oriented in a substantially parallel relationship with respect to each other and/or oriented in a substantially perpendicular relationship with respect to the longitudinal axis 66 of the support 62 or otherwise the general alignment of the sensors. Preferably, one set of the aligned sensors have a first linear arrangement and another set of the aligned sensors have a second linear arrangement, which may be parallel to each other. Also, preferably at least two of the aligned sensors have a first linear arrangement and at least two others of the aligned sensors have a second linear arrangement. A single aligned set of sensors 60 may be used or more than two sets of sensors 60 may be used, as desired.

Referring also to FIG. 4, the sensors 60 may be arranged such that the housings surrounding the current sensors have an overlapping region 70 in a substantially perpendicular direction with respect to the longitudinal axis of the support 62 and/or general alignment of the sensors. Preferably, the openings 64 defined by the sensors 60 are in a non-overlapping relationship 72 with respect to one another and a non-overlapping relationship 74 with respect to other housings. This permits the sensors to be arranged in a more compact arrangement within the power panel.

Referring also to FIG. 5, a respective transient voltage suppressor 80 may be interconnected in parallel across the output terminals of each sensor 60. The transient voltage suppressors 80 limits the voltage build up at the terminals of the sensors 60, which may occur if the sensors are sensing a changing magnetic field while the terminals of the sensors 60 are open circuited. This decreases the likelihood that technicians will be the recipient of an unanticipated electrical shock.

Figure 6:
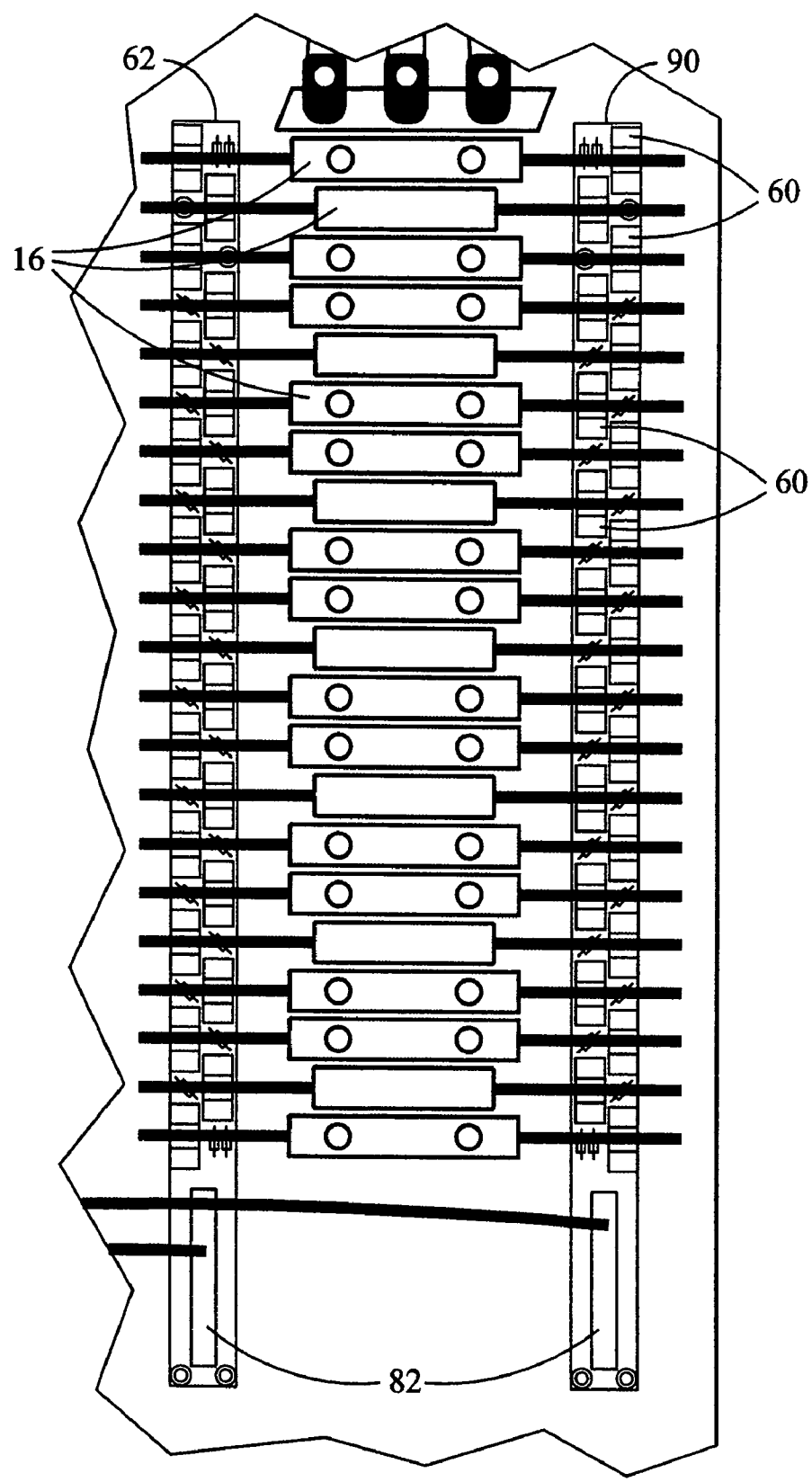
FIG. 6 illustrates a top view of the support and sensors of FIG. 2 together with circuit breakers.

Referring to FIG. 6, the current sensors 60 are preferably arranged in a spatial arrangement such that the openings 64 defined by the current sensors 60 are in a substantially directly opposing relationship with respect to the circuit breakers 16. In other words, the each of the openings 64 is opposing a respective circuit breaker 16. In this manner, the wires from the circuit breakers 16 may be readily routed through a respective sensor 60.

Figure 7:
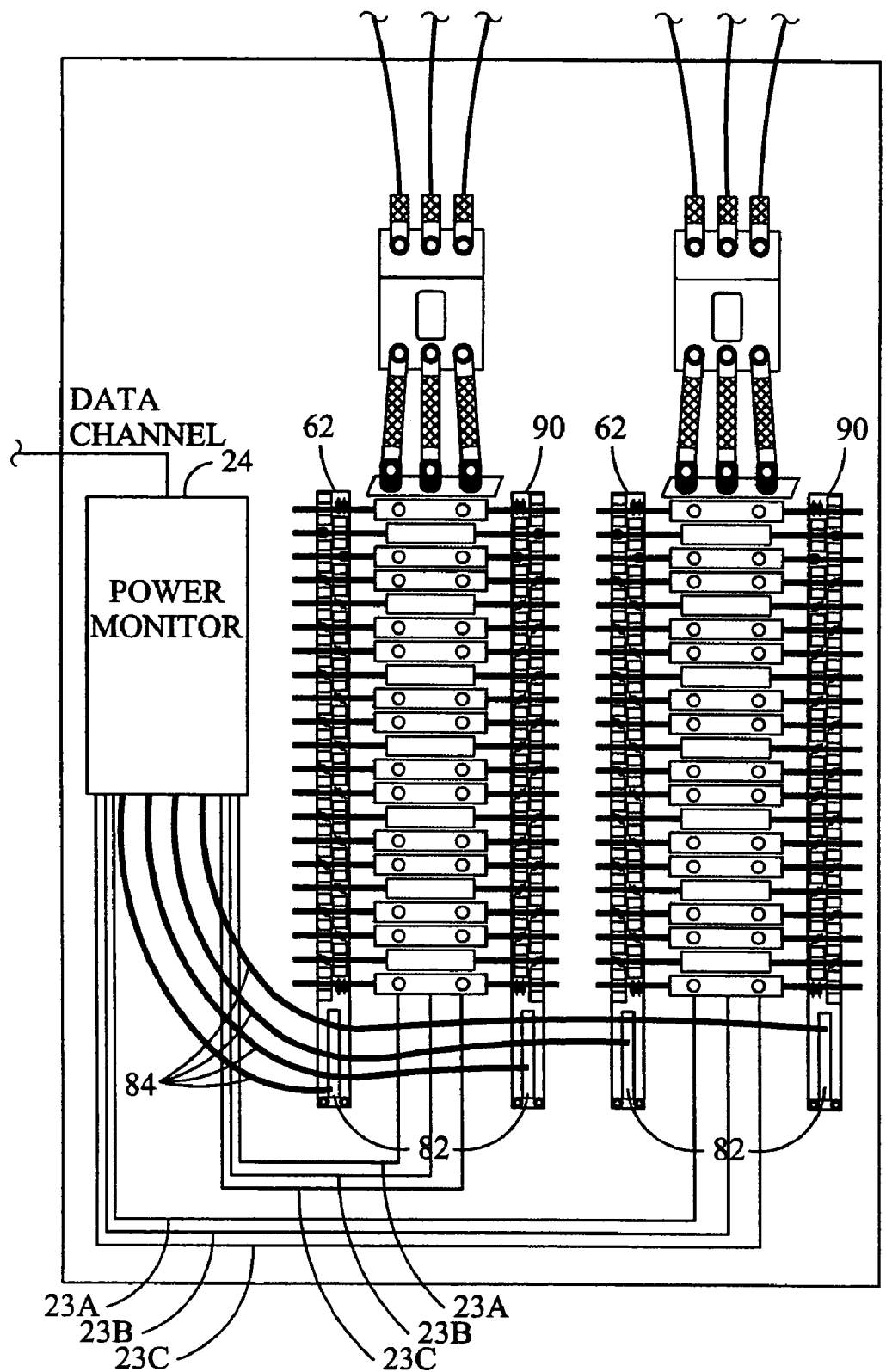
FIG. 7 illustrates a power panel assembly with a power monitor and the support/current sensors of FIG. 3.
Figure 8:
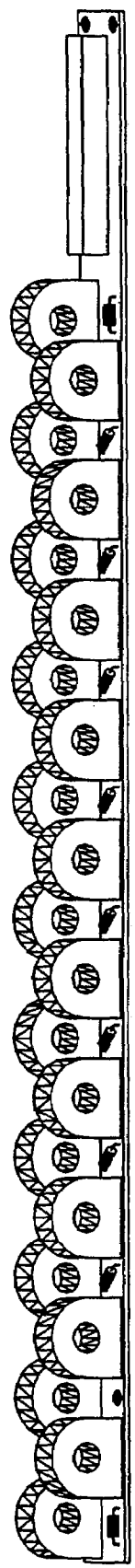
FIG. 8 illustrates a perspective view of another exemplary embodiment of a support for a set of current sensors.
Figure 9:
FIG. 9 illustrates a side view of the support and sensors of FIG. 9.
Figure 10:
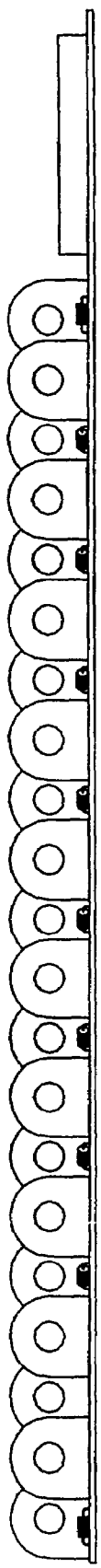
FIG. 10 illustrates a top view of the support and sensors of FIG. 9.

Referring to FIG. 7, during normal installation the support 62 is initially affixed within the power panel in an adjacent spaced apart relationship with respect to a set of circuit breakers 16. A support may be located on both sides of a set of circuit breakers 16, if desired. Another support is illustrated in FIGS. 8, 9, and 10 suitable for the right hand side of the circuit breakers (FIGS. 3, 4, and 5 are suitable for the left hand side). Then, the wires from the loads are passed through the respective sensors and interconnected to a respective circuit breaker 16. In addition, the wires 23a, 23b, and 23c, for sensing the voltage potentials on the bus bars are likewise electrically interconnected. In this manner, the installation of the circuit breakers and the power monitor is efficient, less expensive, economical, and the sensors are in a suitable position with respect to the respective circuit breakers. The support 62 may be suitable for supporting a set of electrical traces that interconnect the sensors 60 to a connector 82. The interconnection from the sensors 60 to the connector 82 are predetermined so that the signals provided to the connector 82 are readily identifiable to the proper sensor 60. This eliminates the potential possibility of improperly interconnecting the wires from the sensors 60 to the connector. A cable 84 interconnects each connector 82 to a power monitor 24. While such a set of supports 62 with respective sensors 60 are suitable for use with new installation, it is difficult to install such a set of sensors 60 to an existing set of circuit breakers with wires already installed. To permit the sensors 60 to be readily interconnected with wires already interconnected to the circuit breakers 16 the sensors 60 may be constructed in a split-core manner. In this manner, the opening 64 may be opened, the wire inserted therein, and the opening 64 closed around substantially all of the wire.

Figure 1:
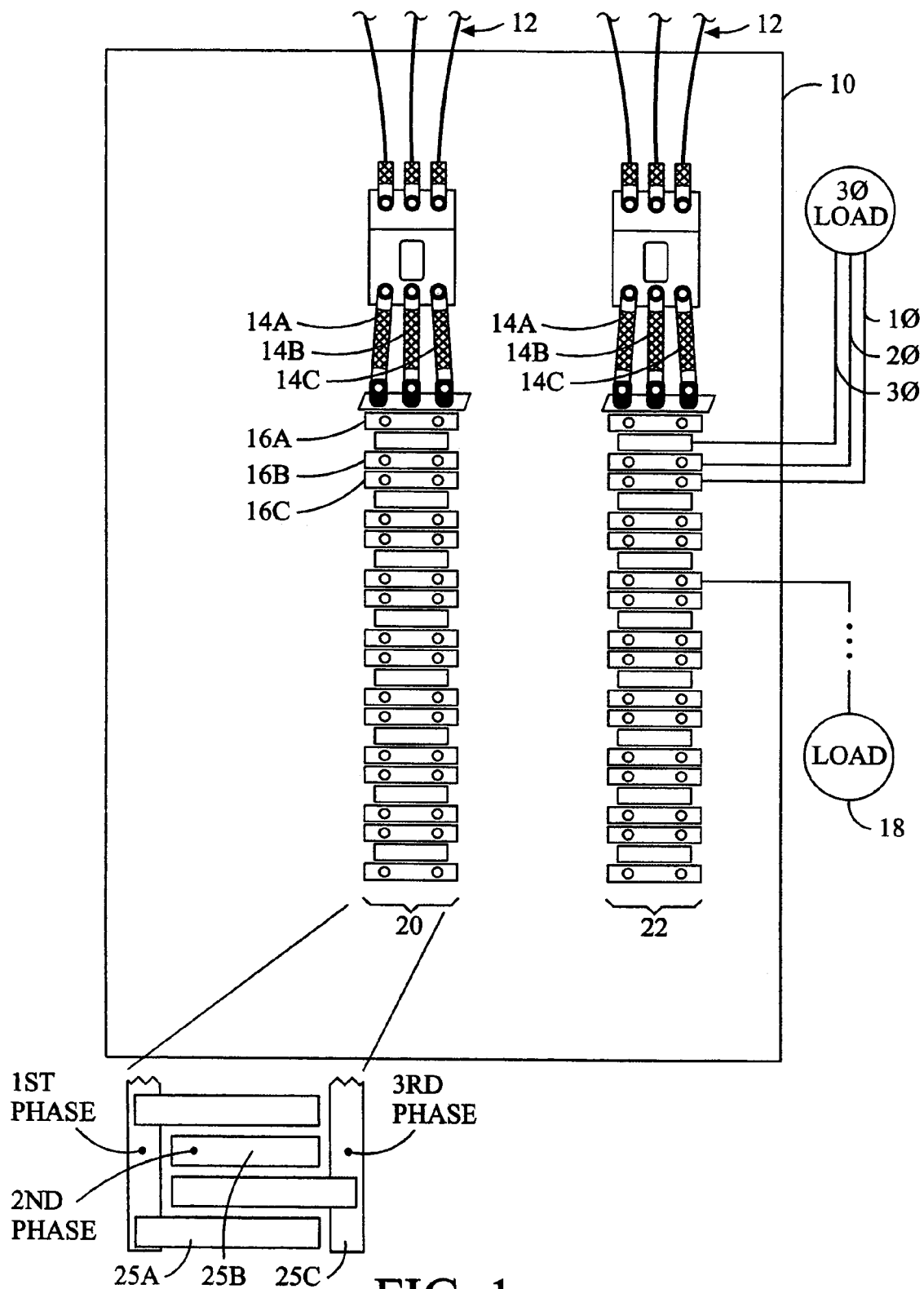
FIG. 1 illustrates a power panel with circuit breakers.

Referring again to FIGS. 1 and 2, traditionally, the electrical installer is required to identify the phase of the bus bars of the power panel, such as phase A ($25(a)$), phase B ($25(b)$), and phase C ($25(c)$) to properly interconnect the wires 23a (phase A), 23b (phase B), and 23c (phase C), to the appropriate bus bar and connection on the power monitor 24. In addition, the electrical installer is required to identify the phase, such as phase A, phase B, and phase C, of each circuit breaker, or phase a multi-phase circuit breaker. With each circuit breaker's phase identified, then the electrical installer is required to properly interconnect each respective current sensor 20 to the appropriate interconnection on the power monitor 24.

The proper installation of a power monitoring system is problematic because the phase of each of the bus bars are normally not identified in a consistent manner, especially when the phase of each bus bar depends upon its interconnection to the power service from the utility. Similarly, the phase of each of the circuit breakers of a multi-phase circuit breaker are not necessarily identified in a consistent manner. Further, the phase of each single phase circuit breaker depends upon its interconnection to one or more of the bus bars, which may be difficult to identify because the interconnection is typically underneath an installed circuit breaker. To further complicate matters, the phase of the current within each of the current sensors depends upon which wire the current sensor is associated with. Accordingly, the electrical installer needs to determine the phase of the bus bar, determine the phase of the associated circuit breaker, identify the wire interconnected with the circuit breaker, associate a particular current sensor with the interconnected wire, and interconnect the current sensor to the appropriate location of the power monitor 24. The likelihood of an electrical installer properly identifying all of these relationships is unlikely, especially the phase relationships between different phases for a particular multi-phase load.

To verify or otherwise determine which phases from the current sensors are associated with which voltage from the bus bars, the traditional approach involves assuming a unity power factor and matching those with the closest phase relationship. However, if the load has a low power factor, which is typical with variable frequency drives, switching power supplies, and flourescent lights, then the phase relationship of the voltage/current between different phases of a multi-phase load are not typically the closest phase relationship. Improperly matching results in erroneous power calculations. A sufficiently low power factor is 0.5 or less. Accordingly, in such a case the system may not automatically verify or otherwise determine the phase relationships between the current sensors and voltages with any degree of confidence.

The present inventor considered the traditional likelihood of improper current sensor installation for power monitoring and the limitations associated with attempting to automatically determine the proper phase association between the current sensors and the associated voltages, in addition to the phase relationships between the current sensors. As opposed to designing a power monitoring system that is less likely to be improperly installed, the present inventor came to the realization that the power distribution system itself may be utilized to identify the appropriate matching between the voltage sensing and current sensing. In particular, a signal may be superimposed on one or more of the bus bars (i.e., the power signals to one or more loads normally of 60 hertz, 120 volt, three phases) and sensed within one or more of the wires to the loads. Alternatively, a signal may be superimposed on one or more of the wires to the loads and sensed within one or more of the bus bars (i.e., the power signals to one or more loads normally of 60 hertz, 120 volt, three phases).

Figure 11:
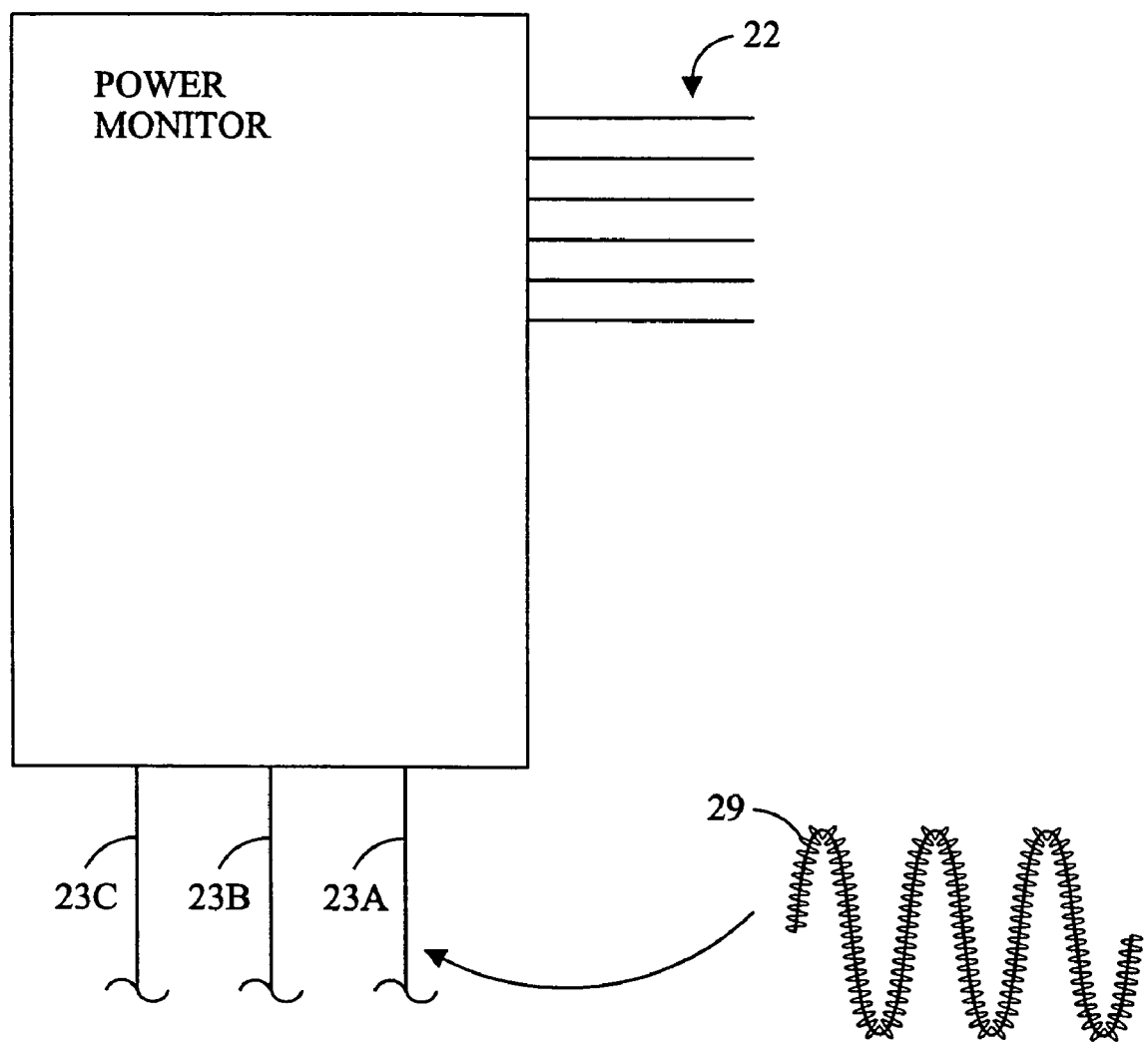
FIG. 11 illustrates the power monitor and superimposed signal.

Referring to FIG. 11, a signal may be selectively superimposed on one or more of the wires 23a, 23b, and 23c to the bus bars within the power panel. Preferably, the superimposed signal 29 is a high frequency signal, such as 2–5 khz or greater, having an amplitude sufficiently greater than the anticipated noise in the power within the bus bars, such as 10 volts, so that the signal may be subsequently detected. Such a sufficiently high frequency signal will tend to become attenuated after propagating a significant distance through the wires thereby minimally affecting the loads. Alternatively, the superimposed signal may be a low frequency signal, such as 5–40 hertz, a medium frequency signal, such as 40 hz–2 khz, a pulsed signal, or a DC signal. It is preferable that the selected superimposed signal 29 is one that is not anticipated to be present at a sufficient magnitude within the power system so that it is not erroneously detected. Also, the selected superimposed signal is preferably one that when added (or subtracted) to the existing signals within the bus bars will not inadvertently result in a significant increase in the likelihood of tripping the circuit breaker. The superimposed signal on one or more of the bus bars will then be transmitted to all of the loads, through the respective circuit breakers, interconnected to the selected bus bar(s). The current sensors are interconnected to the wires to the load and accordingly sense the superimposed signal to the load. The superimposed signal sensed by the current sensors may be passed to the power monitor or otherwise the current sensor may indicate the existence of the superimposed signal to the power monitor.

Figure 12:
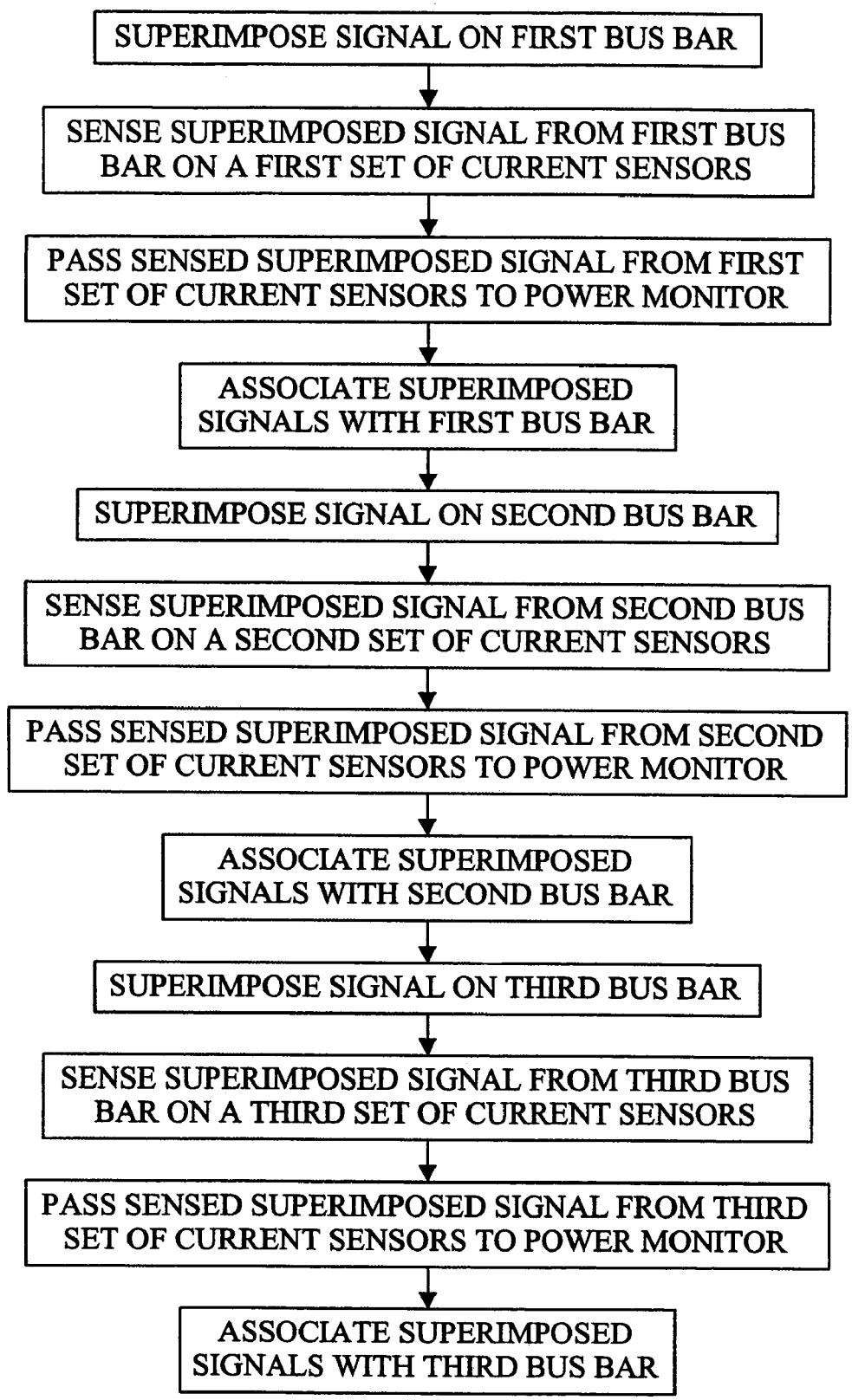
FIG. 12 illustrates a set of steps for phase determination.

Referring to FIG. 12 one example includes a signal superimposed on wire 23a will pass through bus bar 25a, the superimposed signal will pass through the circuit breakers interconnected to bus bar 25a, the superimposed signal will be sensed by the respective current sensors, and the superimposed signal will be passed to the power monitor 24. The power monitor 24 senses the superimposed signals from the current sensors to determine which current sensors are associated with the bus bar associated with wire 23a. A signal superimposed on wire 23b will pass through bus bar 25b, the superimposed signal will pass through the circuit breakers interconnected to bus bar 25b, the superimposed signal will be sensed by the respective current sensors, and the superimposed signal will be passed to the power monitor 24. The power monitor 24 senses the superimposed signals from the current sensors to determine which current sensors are associated with the bus bar associated with wire 23b. A signal superimposed on wire 23c will pass through bus bar 25c, the superimposed signal will pass through the circuit breakers interconnected to bus bar 25c, the superimposed signal will be sensed by the respective current sensors, and the superimposed signal will be passed to the power monitor 24. The power monitor 24 senses the superimposed signals from the current sensors to determine which current sensors are associated with the bus bar associated with wire 23c. In this manner, the system can determine which wires 23, and hence the voltages within the bus bars, are associated with each current sensor, and hence the currents within the load wires. Accordingly, the system may verify or otherwise determine the proper phase relationships between the voltages and currents for a particular load.

It is likewise to be understood that the superimposed signal may be imposed into the load side of the circuit breaker using the current sensors. Then the superimposed signal would be detected from the signals within one or more of the bus bars. In this manner, each individual current sensor may be individually mapped to the corresponding bus bar, and hence phase. This technique is preferably used by imposing the superimposed signal on each current sensor in a serial fashion.

It is likewise to be understood that the superimposed signal may be simultaneously imposed onto one or more of the bus bars, or one or more of the current sensors. Then the lack of detecting the superimposed signal may be used, possibly together with multiple such tests, to determine the relationship between the bus bars and the current sensors (i.e., voltage and current).

It is likewise to be understood that the superimposed signal may be simultaneously imposed into one or more of the bus bars, or into one or more of the current sensors even if the power to the bus bars and hence the loads is not provided. In this circumstance, the superimposed signal will be superimposed on "zero" volts and thus be the only signal sensed. Moreover, the imposing of the superimposed signal and the sensing of the superimposed signal may be provided on the same side of the circuit breaker, such as the load side or the "utility" side. Also, the superimposed signal may be simultaneously imposed on both the current sensor(s) and the bus bar(s).

While such a power association system is especially suitable for determining the phase relationship between the voltage and current, it may likewise be used for troubleshooting whether or not a circuit breaker has been tripped. For example, during normal operation of the loads it may be desirable to determine whether the load has ceased normal operation, the circuit breaker has tripped causing the load to cease operation, otherwise determine the state (un-tripped or tripped) of the circuit breakers. To determine the current state of the circuit breakers, the power monitor may superimpose a signal on the current sensors and/or the bus bars for all or a portion of the circuit breakers, and determine whether or not the circuit breaker is operational (i.e. whether the superimposed signal passes through the circuit breaker).

To provide effective monitoring of the power usage used by the loads, the power monitor 24 may monitor the current levels of each of circuit breakers 16 together with the associated voltage potential and phase relationship.

The power monitor 24 may likewise be used to monitor the load balance between the different phases of the power panel 10. Frequently, the circuit breakers may be interconnected to a single phase when the loads require 120 volts, interconnected to two phases when the loads require 240 volts, and interconnected to three phases when the loads require three phase power. For example, the first phase of the power panel 10 may be supplying 70 amps, the second phase of the power panel 10 may be supplying 30 amps, and the third phase of the power panel 10 may be supplying 150 amps. This significant imbalance in the current supplied by the different phases is sub-optimal. For example, the greater the current levels the greater the voltage drop from the power source to the power panel, which may result in significant variations in the voltage levels provided to the power panel from the three phase power source. By monitoring the current (or power) provided from each phase using the sensors, the loads may be redistributed between the different phases to re-balance the loads.

In an alternative embodiment the power factor for one or more phases may be presumed to be a constant value. The power factor (normally the cosine of the phase difference) may be based upon historical measurements, test measurements, anticipated power factor, desired power factor, or otherwise omitted from the calculation of power usage (equivalent to using a power factor of "1").

In an alternative embodiment the power factor, the voltage potential, and/or the current may be calculated, sensed, or otherwise measured for a single phase of a multi-phase load. The power monitor may then use the voltage potential and current, together with the power factor if desired, to calculate the power usage of a multi-phase load by presuming that the remaining phases have similar characteristics. For example, in a three phase system the remaining phases may be presumed to have approximately a 60 degree phase difference. Reusing power calculations for other phases reduces the computation complexity of the power monitor while maintaining relatively accurate power measurements.

In an alternative embodiment, the power factor of a multi-phase load may be determined based upon one of the voltages and one of the currents, both of which are preferably associated with the same phase. The power factor may then be used for all of the phases, if desired. Reusing the calculated power factor reduces the computational complexity of the power monitor while maintaining relatively accurate power measurements.

In an alternative embodiment, the power monitor may, if desired, separate multiple summed alternating voltage signals into their respective phases for power determination, typically by decomposition of the composite signal.

In an alternative embodiment, multiple electrical interconnections may be provided from the power monitor to each of the multiple bus bars or otherwise the voltage potentials of the different phases. Preferably, at least one of the electrical interconnections from the power monitor to at least one of the multiple bus bars, or otherwise the voltage potential of at least one phase, is used together with different current sensors for a plurality of different loads.

In an alternative embodiment, all or a portion of the power monitoring system may be located outside of the power panel.

Referring to FIG. 13 in an alternative embodiment, it may be desirable have the power monitor configurable to select which current sensors correspond to the same load. In addition, the current sensors may be associated with the corresponding sensed voltage. Also, the phase relationship of the current sensors and voltages may be indicated if more than one phase is provided to the load. The use of the currents and voltages, together with the power factor if appropriate, may be used to determine the power usage. The configuration may likewise enable and disable the use of the power factor, if desired. Also, information regarding other phases that are not available may be calculated by the power monitor based upon the other phases. In addition, the power factor and/or voltage may be preset, if desired. Further, the load number, the phase relationships, and the power factor may be automatically configured, if desired.

The terms and expressions which have been employed in the foregoing specification are used therein as terms of description and not of limitation, and there is no intention, in the use of such terms and expressions, of excluding equivalents of the features shown and described or portions thereof, it being recognized that the scope of the invention is defined and limited only by the claims which follow.

The invention claimed is:

1. A power monitoring system comprising:
    (a) a first current sensor suitable to sense first changing electrical current within a first conductor to a first load;
    (b) a second conductor sensing a first voltage potential provided to said first load;
    (c) a power monitor superimposes a first signal on one of said first conductor and said first current sensor;
    (d) sensing said first signal on the other of said first conductor and said first current sensor; and
    (e) associating said first voltage potential with said first changing electrical current when calculating the power usage of said first load;
    (f) a second current sensor suitable to sense second changing electrical current within a third conductor to said first load;
    (g) a fourth conductor sensing a second voltage potential provided to said first load;
    (h) said power monitor superimposes a second signal on one of said third conductor and said second current sensor;
    (i) sensing said second signal on the other of said third conductor and said second current sensor;
    (j) associating said second voltage potential with said second changing electrical current when calculating the power usage of said first load.

2. The system of claim 1 wherein said first signal passes through a circuit breaker prior to said sensing.

3. The system of claim 1 wherein said first conductor is interconnected to a bus bar within a power panel.

4. The system of claim 1 wherein said first current sensor includes a wire wound torodial core.

5. The system of claim 1 wherein said first conductor is an elongate wire.

6. The system of claim 1 further comprising
(a) a power panel;
(b) a plurality of circuit breakers within said power panel; and
(c) said power monitor within said power panel.

7. The system of claim 6 wherein said first signal passes through one of said circuit breakers prior to said sensing.

8. The system of claim 7 wherein said first signal has a frequency greater than 2000 hertz.

9. The system of claim 7 wherein said first signal is superimposed on an energized conductor.

10. The system of claim 7 wherein said first signal is superimposed on a non-energized conductor.

11. The system of claim 1 wherein said second conductor and said fourth conductor are electrically interconnected to each other.

12. The system of claim 1 wherein said second conductor and said fourth conductor are electrically isolated from one another.

* * * * *